US005602079A

United States Patent [19]
Takenaka et al.

[11] Patent Number: 5,602,079
[45] Date of Patent: Feb. 11, 1997

[54] METHOD AND APPARATUS FOR FABRICATING SUPERCONDUCTOR DEVICE

[75] Inventors: Tsuyoshi Takenaka, Himeji; Katsumi Suzuki, Kodaira; Shuichi Fujino, Oomiya; Youichi Enomoto, Nerima-ku, all of Japan

[73] Assignees: International Superconductivity Technology Center, Tokyo; Kawasaki Jukogyo Kabushiki Kaisha, Hyogo-ken; NEC Corporation; Mitsubishi Materials Corporation, both of Tokyo, all of Japan

[21] Appl. No.: 254,707

[22] Filed: Jun. 6, 1994

[30] Foreign Application Priority Data

Jun. 10, 1993 [JP] Japan .................................... 5-138709

[51] Int. Cl.$^6$ ...................................... B23K 26/12
[52] U.S. Cl. ............... 505/310; 219/121.69; 219/121.83; 219/121.86; 505/412
[58] Field of Search ...................................... 505/410, 412, 505/950, 310, 474; 219/121.68, 121.69, 121.76, 121.83, 121.86; 118/724

[56] References Cited

U.S. PATENT DOCUMENTS

| | | | |
|---|---|---|---|
| 4,964,940 | 10/1990 | Auvert et al. | 219/121.68 |
| 5,191,187 | 3/1993 | Kajikawa | 219/121.83 |
| 5,223,798 | 6/1993 | McGinnis et al. | 505/1 |
| 5,268,646 | 12/1993 | Doss | 324/633 |
| 5,330,968 | 7/1994 | Nagaishi et al. | 505/474 |

*Primary Examiner*—Geoffrey S. Evans
*Attorney, Agent, or Firm*—Oliff & Berridge

[57] ABSTRACT

A superconducting device having a superconducting film measures a characteristic such as its resonance frequency while in an environment having a temperature that is less than or equal to its superconducting transition temperature. A laser then thermally etches the superconducting film on the basis of said measurement in the environment having a temperature that is less than or equal to a superconducting transition temperature.

6 Claims, 7 Drawing Sheets

METHOD AND APPARATUS FOR FABRICATING SUPERCONDUCTOR DEVICE

DETAILED DESCRIPTION OF THE INVENTION

1. Industrial Field of the Invention

The present invention relates to a method of fabricating a superconducting device, and, in particular, to a method and apparatus for fabricating a superconducting device that includes a step of using a laser to implement a specific process on a superconducting film formed on a substrate.

2. Prior Art

The use of either wet etching or dry etching by a photolithographic method is known as a conventional technique for implementing a specific process on a superconducting film formed on a substrate by a method of fabricating a superconducting film, as well as the use of a laser such as an excimer laser or a focused flow of ions.

One technique for implementing a specific process on a superconducting film with the use of a laser is disclosed in a paper by P. H. Ballentine, A. M. Kadin, M. A. Fisher, and D. S. Mallory, IEEE Transactions on Magnetics, 25, 950 (1989). This paper takes a method of working a yttrium-barium-copper-oxide (YBCO) film formed as a superconducting film to a thickness of 0.5 to 1.5 µm yttrium stabilized zirconia (YSZ) substrate and compares it with photolithography using wet etching and a method that uses a laser.

Figure 6:
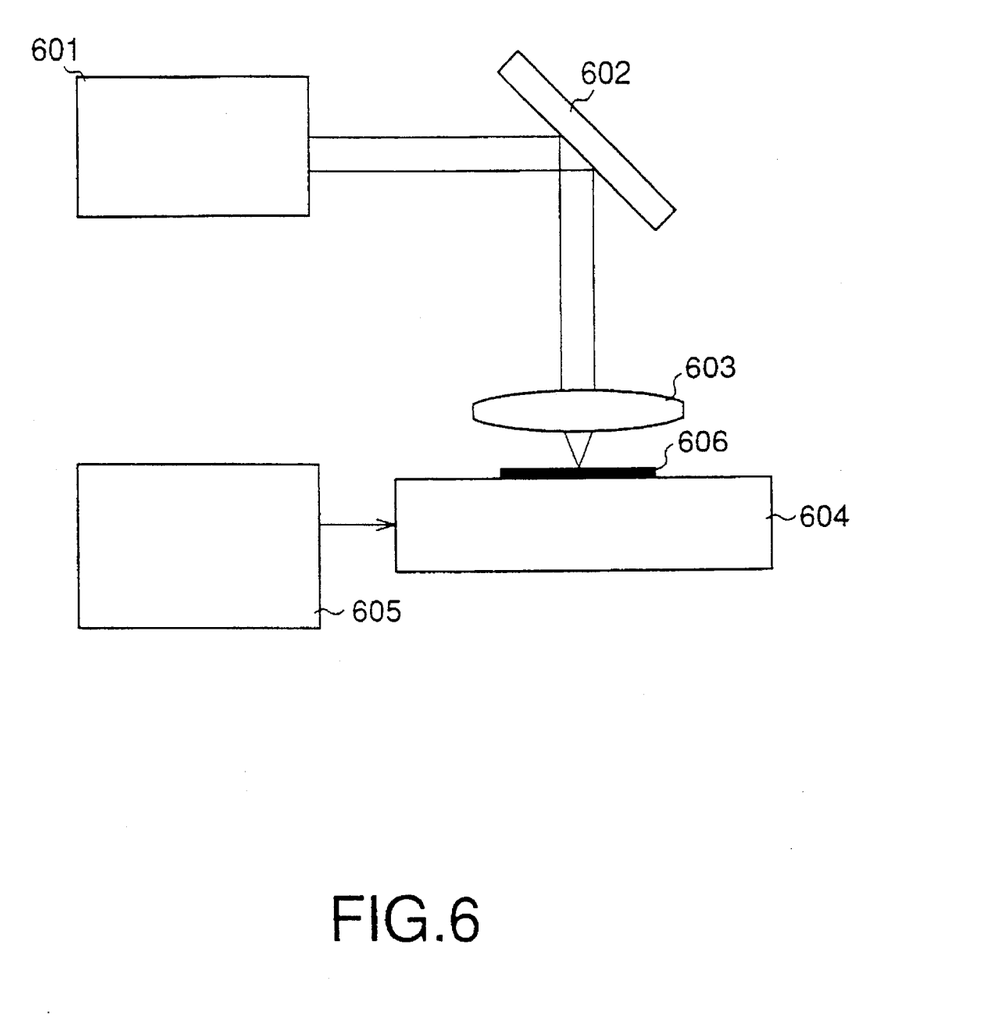
FIG. 6 is a conceptual sketch of an example of the configuration of a laser patterning apparatus in accordance with the prior art.

With this technique, the laser patterning apparatus shown in FIG. 6 is used for the process that uses a laser. In this figure, a superconducting sample (substrate plus superconducting film) 606 is mounted on an X-Y table 604, and a laser beam that is output as pulses from a neodymium-yttrium aluminum garmet (Nd-YAG) laser 601 is reflected by a mirror 602 and an objective lens 603 onto the superconducting film (not shown in the figure) on the surface of the superconducting sample 606. During this time, the X-Y table 604 is moved by using a microprocessor 605, so that, if the position of the superconducting sample 606 is controlled in this manner, any desired process can be implemented on the superconducting film by using the laser beam. This paper suggested that lines of a width of 2 to 5 µm could be formed by this method.

Another method of implementing a specific process on a superconducting film by using a laser is disclosed in "The Review of Laser Engineering", Volume 18, No. 7, p. 627 (1991). With this method, the process at room temperature is performed using a krypton fluoride (KrF) excimer laser of wavelength 248 nm on a YBCO film that was formed by an MOCVD method on a magnesium oxide (MgO) substrate, to create a Josephson element. Then measurement of the response characteristics of the thus-created Josephson element with respect to microwaves or millimeterwaves is implemented at the temperature of liquid nitrogen (77 K).

Figure 7:
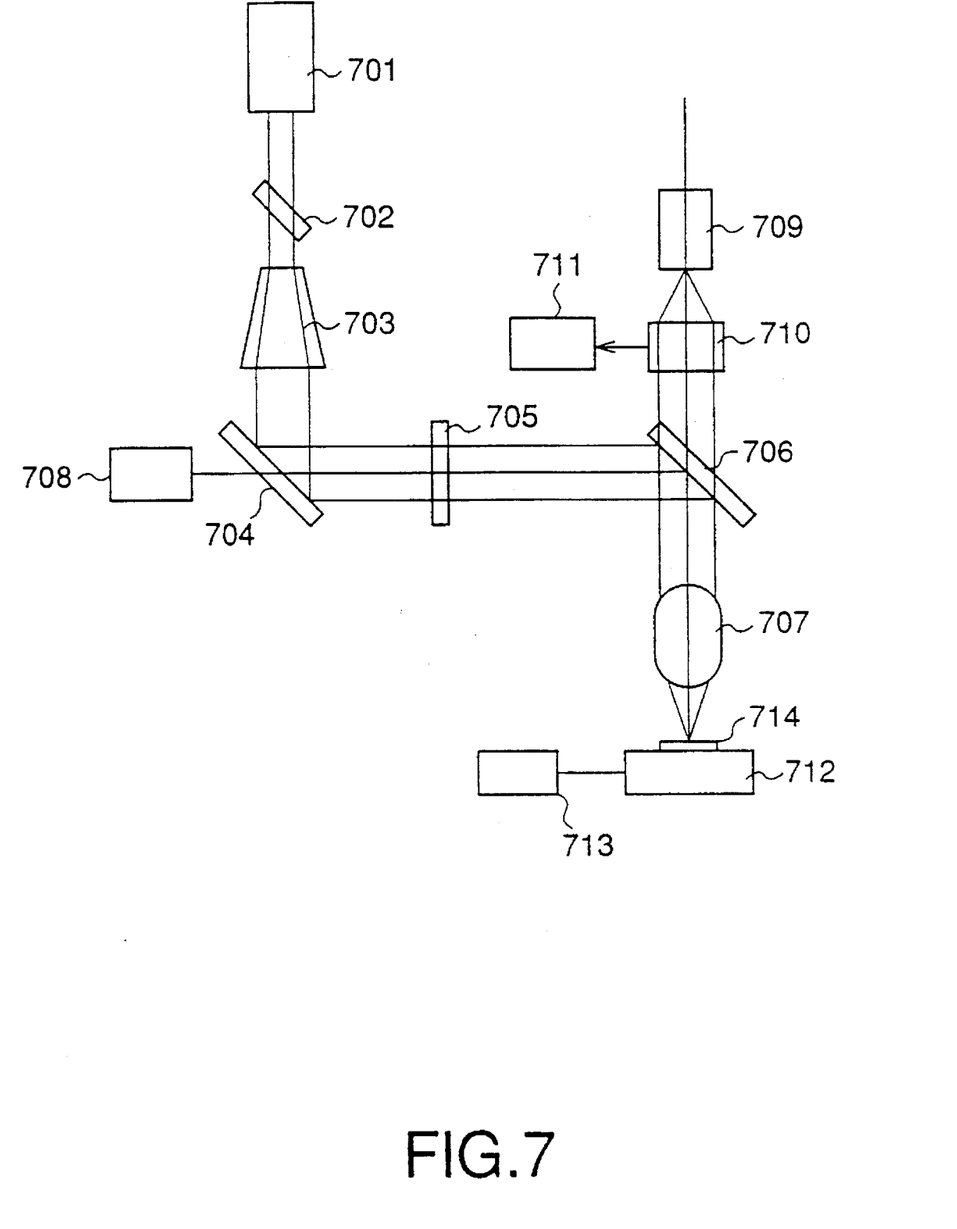
FIG. 7 is a conceptual sketch of an example of the configuration of another laser patterning apparatus in accordance with the prior art.

This technique uses the laser patterning apparatus shown in FIG. 7. As shown in this figure, the light strength of a laser beam that is pulse-output from a KrF excimer laser 701 of this apparatus is adjusted by an attenator 702, then the laser beam is subjected to processing that creates a uniform energy distribution by a beam expander 703, and is reflected by a beam splitter 704. After the beam has passed through a mask 705 and been reflected by another beam splitter 706, it is focused by an objective lens 707 and shone onto a superconducting film (not shown in the figure). During this time, an X-Y table 712 is moved by a microprocessor 713, and the resultant control of the position of a superconducting device 714 ensures that the superconducting film is etched by the laser beam.

Monitoring of the etching region in this apparatus is performed by using a monitor 710 and an eyepiece lens 709, and selection of the etching position and confirmation of the progress is implemented using the monitor 710 and a monitor TV 711. In order to confirm the etching position during the process, a laser beam that is output by a He-Ne laser 708 is shone in the same direction as the laser beam of the KrF excimer laser 701 through the beam splitter 704, to act as a marker on the superconducting film.

A further method for implementing a specific process on a superconducting film is disclosed in the Proceedings of the 3rd International Conference and Exhibition "World Congress on Superconductivity", Sept. 14–18 , 1992, Munich, by K. Suzuki, S. Fujino, T. Takenaka, K. Yamaguchi, T. Morishita, K. Imai, F. Suginoshita, N. Yazawa, and M. Kobayashi, P. 1575. With this method, a KrF excimer laser is used in the fabrication of a resonator. This technique is used to set its design properties of the resonator by adjusting the size of a gap in a superconducting film.

Problem to be Solved by the Invention

During the sequence of fabricating a superconducting device in accordance with the prior art, the above described process is performed at room temperature. The various characteristics of the thus-processed superconducting device are then measured at the superconducting transition temperature or lower, and, if is it necessary to modify the pattern on the superconducting film, the process is performed once again from the start at room temperature.

Thus, the temperature must be changed every time the cycle of characteristics measurement and re-processing of the superconducting film is repeated, and thus this technique has the problem that a long time is required for the fabrication.

This problem is particularly prevalent in a radio-frequency device using superconducting film techniques where, because the characteristics are strongly dependent on the shape of the superconducting film, subtle adjustment of the superconducting film pattern is necessary. Therefore, the time required for the fabrication sequence is extremely long and the yield is also deteriorated, so that a device that satisfies its design properties ends up being extremely expensive.

In contrast, if it were possible to modify the patterning on the superconducting film based on a characteristic obtained when the superconducting device is in a normal conductive state, there would be no need to change the temperature, and it will be possible to reduce the time required for the fabrication sequence.

However, this is currently very difficult because it is not yet clear what is the relationship between the characteristics of a superconducting device when is in a normal conducting state and when it is at a superconducting state, and thus it would require a great deal of time and effort in order to create the data for modifying the superconducting film pattern based on the characteristics in the normal conducting state.

SUMMARY OF THE INVENTION

The present invention was devised in view of the above problems with the prior art techniques and has as its objective the provision of a method and apparatus for fabricating a superconducting device, that can perform precision processing within a short period of time in a fabrication sequence.

Means of Solving the Problem

The method of fabricating a superconducting device in accordance with the present invention comprises steps of: forming an environment at less than or equal to a superconducting transition temperature, in order to enclose a superconducting device that comprises a superconducting film formed on a substrate; measuring a predetermined device characteristic relating to the superconducting device in the above environment; and performing a specific process by a laser on the superconducting film in the above environment, based on the predetermined device characteristic measured in the previous measurement step.

The present invention also relates to an apparatus for fabricating a superconducting device that comprises: a X-Y-Z-θ table on which is mounted a superconducting device that comprises a superconducting film formed on a substrate, and which can take up any desired position and attitude; a cooled portion which is provided above the X-Y-Z-θ table; which forms an environment at less than or equal to a superconducting transition temperature, and which encloses a superconducting device in the above environment; means for measuring a characteristic of the superconducting device that is enclosed in the cooled portion; and means for shining a laser beam onto the superconducting film of the superconducting device that is enclosed in the cooled portion.

DESCRIPTION OF THE PREFERRED EMBODIMENT

Figure 1:
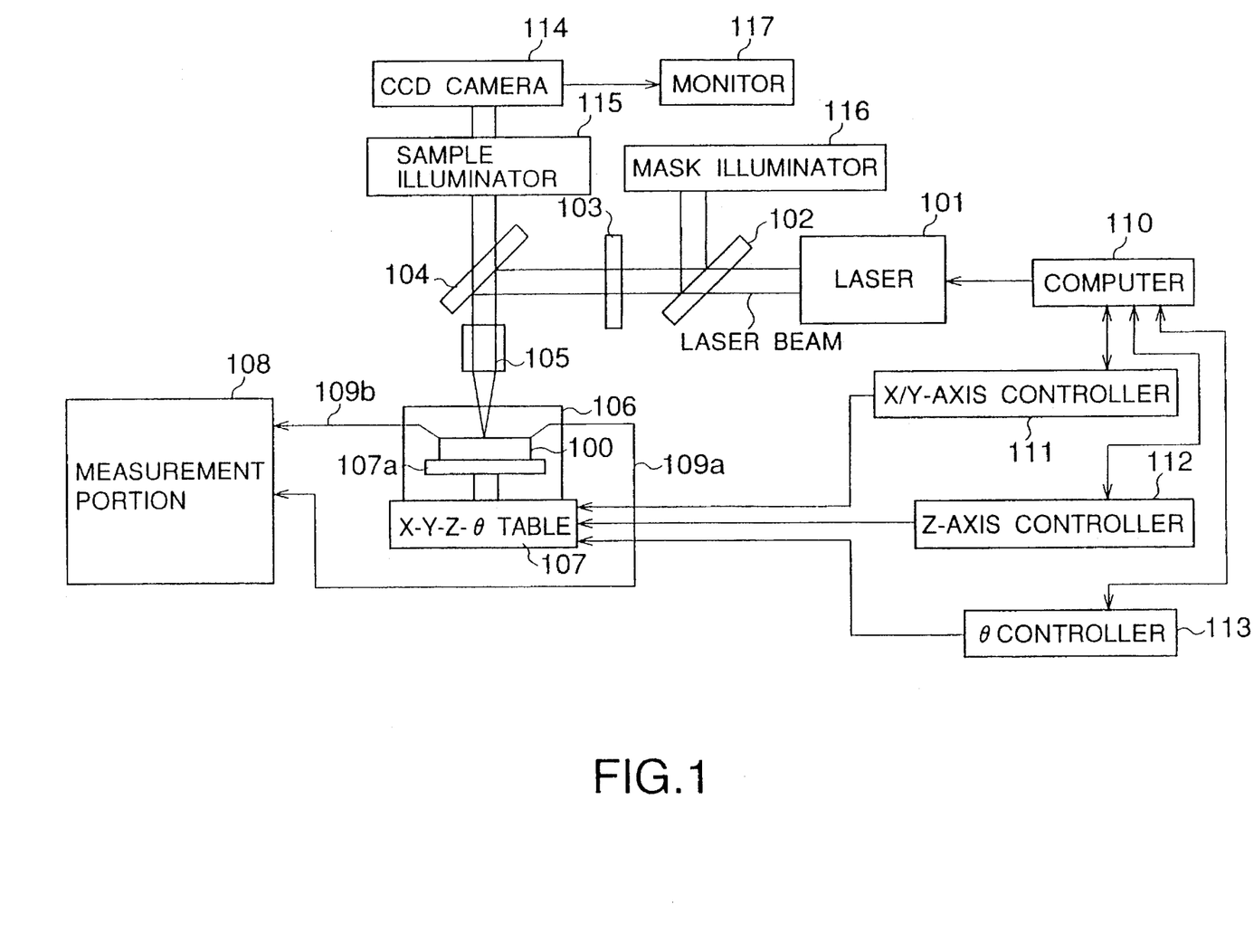
FIG. 1 is a conceptual sketch of an example of the configuration of a laser patterning apparatus in accordance with an embodiment of the present invention.

An embodiment of the present invention will now be described, with reference to the fabrication of a microstrip line resonator. A conceptual sketch of the configuration of a laser patterning apparatus in accordance with this embodiment is shown in FIG. 1.

In this figure, a laser beam that is output from a laser 101 passes through a beam splitter 102 and reaches a mask 103. The laser beam that has passed through the mask 103 is reflected by another beam splitter 104, then is focused by a reducing optical system 105 and shone onto a superconducting film (not shown in the figure) on a resonator (superconducting device) 100.

The resonator 100 is mounted on a mounting stand 107a of an X-Y-Z-θ table 107. This mounting stand 107a is provided within a cooled portion 106 and can be maintained at a predetermined temperature that is equal to or less than the superconducting transition temperature of the resonator 100.

The position of the mounting stand 107a can be adjusted freely by using a computer 110 to control an X/Y-axis controller 111, a Z-axis controller 112, and a θ controller 113. In this manner, the position of the mounting stand 107a is moved, and thus the position of the resonator 100 is controlled in such a manner that etching can be performed on the superconducting film by a laser beam.

A mask illuminator 116 outputs a mask illumination light. This mask illumination light is reflected by the beam splitter 102 to shine on the mask 103.

A measurement portion 108 and cables 109a and 109b are used to measure a characteristic (resonance frequency $f_0$, in this embodiment) of the resonator 100 mounted on the mounting stand 107a.

In this apparatus, sample illumination light that is output from a sample illuminator 115 is passed through the beam splitter 104 and the reducing optical system 105 and shines onto the superconducting film via the beam path in the cooled portion 106, and the etching region can be observed by capturing reflected sample illumination light by a CCD camera 114 and imaging it on a monitor TV 117.

Figure 2:
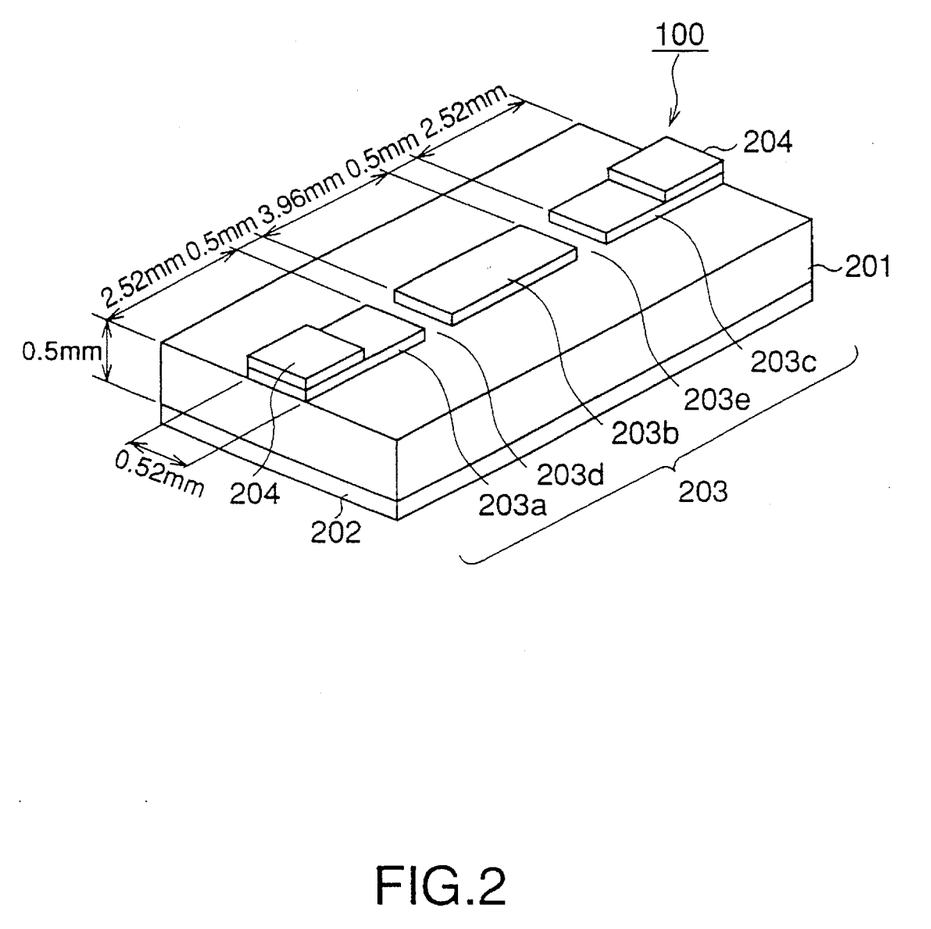
FIG. 2 is a perspective view of the configuration of a microstrip line resonator in accordance with an embodiment of the present invention.

A perspective view of a microstrip line resonator 100 fabricated by this embodiment is shown in FIG. 2.

In this figure, a 3-μm thick ground plane 202 is formed of gold on the lower surface of a 0.5-mm thick substrate 201 of MgO (100). A YBCO oxide superconducting body 203 that is 350 nm thick, 0.52 mm wide, and 10 mm long is formed on the upper surface of the MgO (100) substrate 201.

In this embodiment, the YBCO oxide superconducting body 203 is formed by a pulse-laser deposition method using a $YBa_2Cu_3O_{7-x}$ target and a KrF excimer laser. During this time, the substrate temperature is 750° C. and the oxygen pressure is 40 Pa.

The YBCO oxide superconducting body 203 is provided with 0.5-mm wide grooves 203d and 203e at positions 2.52 mm from the two ends thereof. These grooves divide the YBCO oxide superconducting body 203 into an approximately 3.96-mm long YBCO film 203b arranged at the center and two 2.52-mm long YBCO films 203a and 203c arranged at the ends. A 1-μm thick gold electrode 204 is formed on the surface of each of the YBCO films 203a and 203c.

Figure 3:
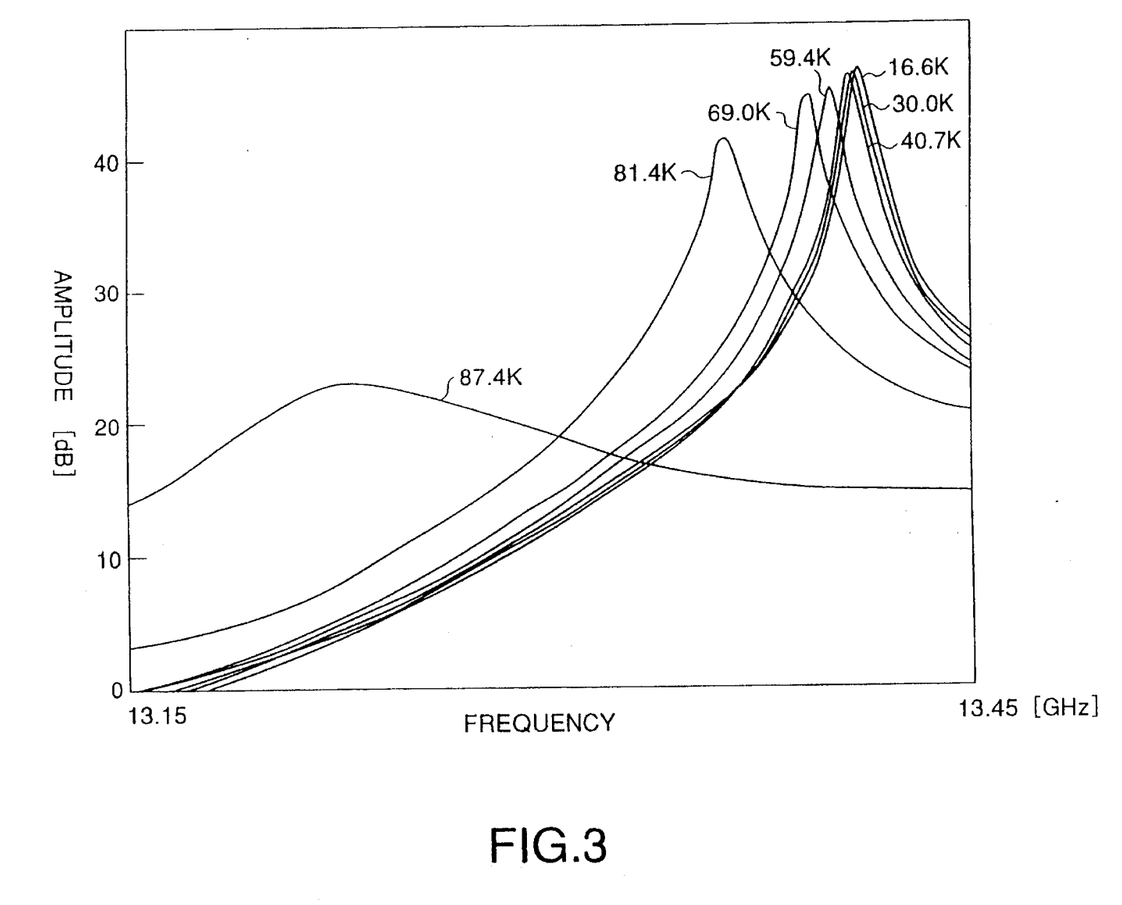
FIG. 3 is a graph showing resonance peaks of the microstrip line resonator of FIG. 2.

In this embodiment, the present invention is used to form the grooves 203d and 203e of the YBCO oxide superconducting body 203. In other words, to ensure that the resonance frequency $f_0$ has a predetermined value at a temperature of 16 K, the process (formation of the grooves 203d and 203e) is performed while the resonance frequency $f_0$ is being measured by the measurement portion 108, with the cooled portion 106 (see FIG. 1) held at a temperature of 16 K. Resonance peaks when the temperature ranges from 16 K to 88 K are shown in FIG. 3. Since the resonance frequency of the resonator 100 is dependent on temperature, as shown in this graph, it is extremely difficult to modify the patterning of the superconducting film based on this characteristic when it is measured when the resonator 100 is in a normal conductive state.

Figure 4:
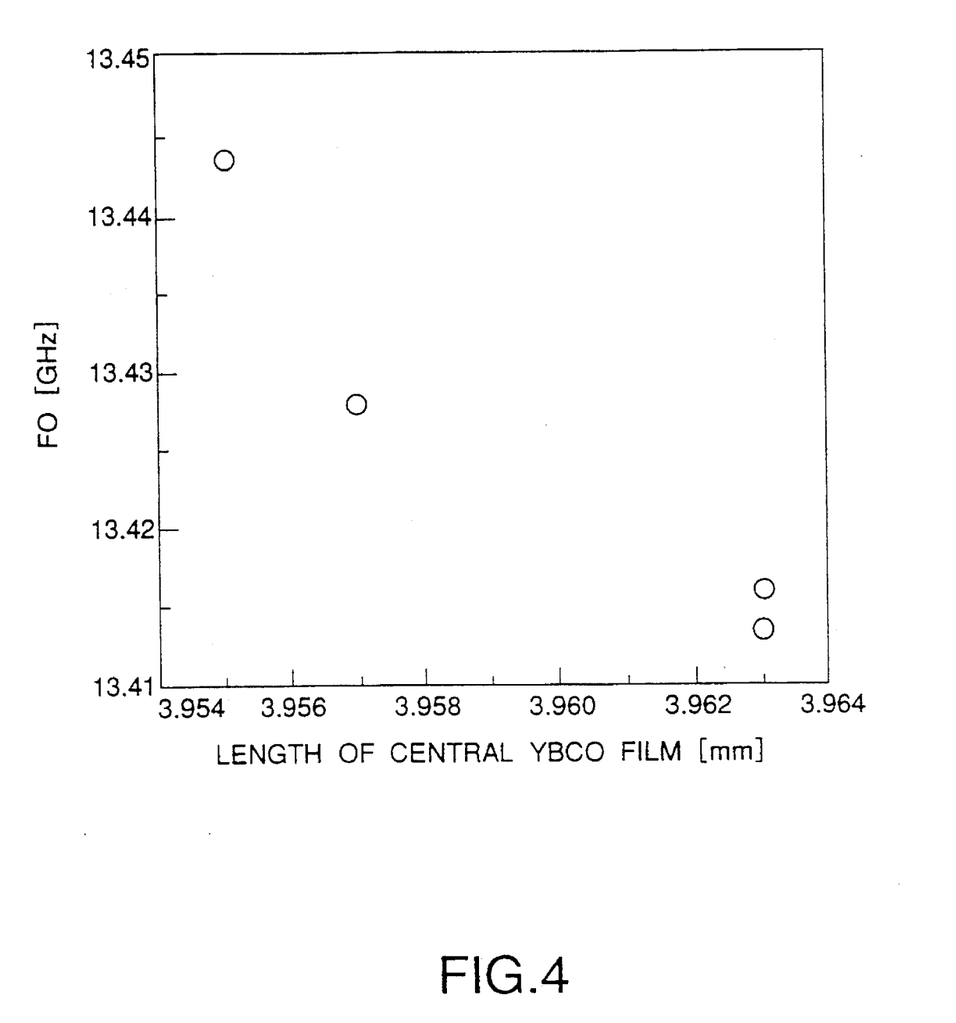
FIG. 4 is a graph illustrating the relationship between the processed pattern on the superconducting film and an operating characteristic of the microstrip line resonator of FIG. 2.

The resonance frequency $f_0$ when the temperature is 16 K is plotted against length of the YBCO film 203b in FIG. 4. As is clear from this graph, the resonance frequency $f_0$ decreases as the YBCO film 203b becomes longer. Therefore, the resonance frequency $f_0$ can be set to any desired value by forming the grooves 203d and 203e while the resonance frequency $f_0$ is being measured.

Figure 5:
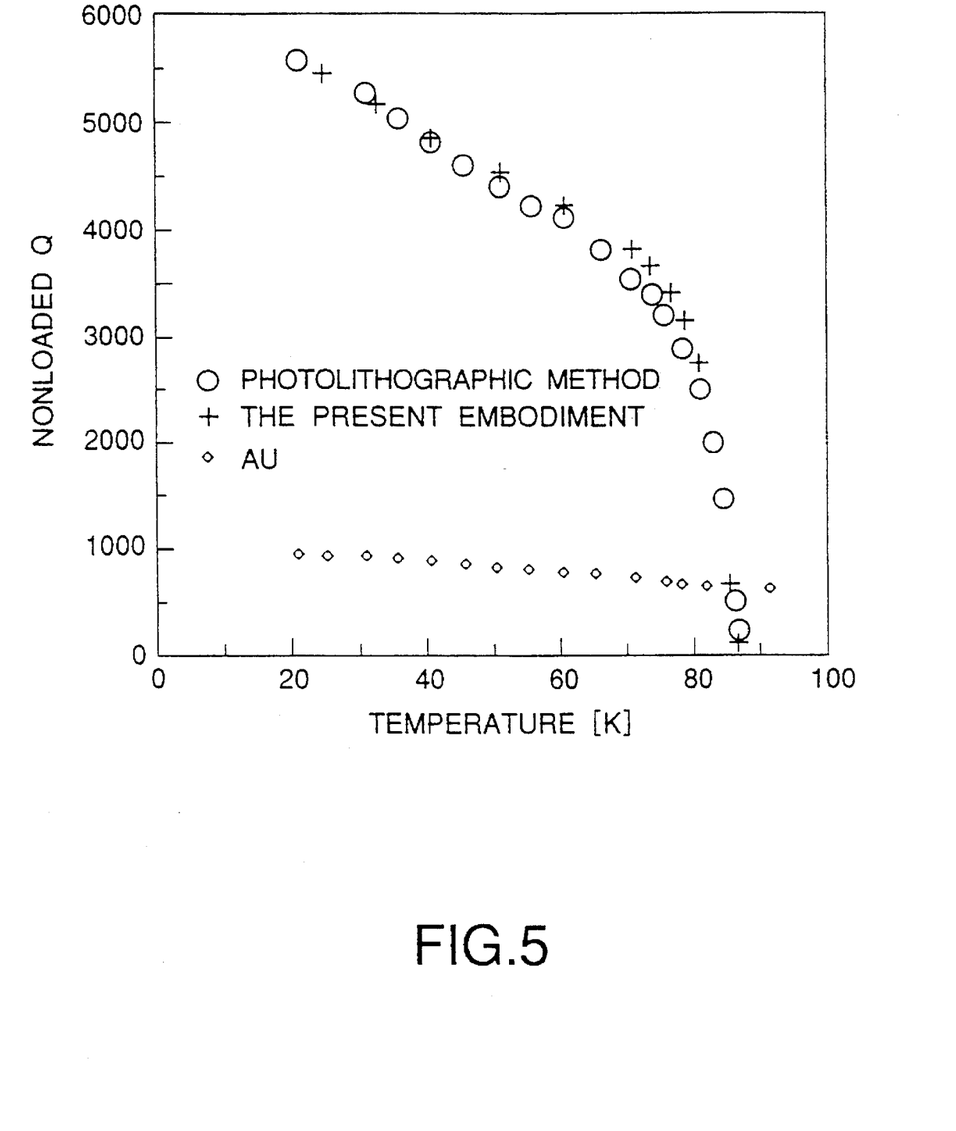
FIG. 5 is a graph of the characteristics of a microstrip line resonator fabricated using the present invention and a microstrip line resonator fabricated using prior art techniques.

A graph comparing the nonloaded Q of a resonator fabricated by the present embodiment with the nonloaded Q of a resonator fabricated by a prior art fabrication method (a fabrication method using photolithography) is shown in FIG. 5. As is clear from this graph, substantially the same value of nonloaded Q as that of the resonator fabricated by the prior art fabrication method can be obtained by the present embodiment.

Thus, since the present embodiment both measures the resonance frequency $f_0$ and also forms the grooves 203d and 203e in the YBCO oxide superconducting body 203 at a temperature (16 K) that is less than or equal to the superconducting transition temperature, it is not necessary to change the temperature within the cooled portion 106 for either of these steps. Therefore, the time required for the fabrication sequence can be reduced.

Further, since the forming of the grooves 203d and 203e is implemented while the resonance frequency $f_0$ is being measured, the length of the YBCO film 203b that corresponds to the measured value can be determined extremely easily. In other words, since the desired resonance frequency $f_0$ can be obtained so easily, the yield can be increased and a resonator that satisfies its design properties can be provided inexpensively.

Other Embodiments

The above embodiment used the temperature of 16 K as an example but it should be obvious to those skilled in the art that the present invention is not limited thereto and is applicable to any temperature, providing it is less than or equal to the superconducting transition temperature.

The embodiment was described above with reference to the application of the present invention to the fabrication of a microstrip line resonator, but the present invention should not be taken as being limited thereto. For example, the effects of the present invention can be achieved when applied to other types of superconducting devices, such as filters, delay lines, and Josephson elements.

Further, a YBCO oxide superconducting body was used in the above embodiment, but the present invention is not limited thereto and can be applied in the same manner to other superconducting bodies such as those of bismuth and thalium oxides.

Effect of the Invention

Since the present invention creates an environment at a temperature that is less than or equal to the superconducting transition temperature and continuously performs measurements and processing at a temperature that is less than or equal to the superconducting transition temperature, it obviates the necessity of changing the temperature every time the cycle of characteristics measurement and re-processing of the superconducting film is repeated, so that the time required for the fabrication sequence can be reduced.

Since the process is implemented at the same time as the measurement, in a superconducting state, precision processing for obtained the desired characteristic can be implemented easily, and thus a device that satisfies its design properties can be provided inexpensively.

What is claimed is:

1. A method of fabricating a superconducting device, comprising the steps of:

forming an environment at less than or equal to a superconducting transition temperature, in order to enclose a superconducting device that comprises a superconducting film formed on a substrate;

measuring a predetermined device characteristic relating to said superconducting device in said environment; and shining a laser beam onto said superconducting film in said environment, based on said predetermined device characteristic measured in the previous measurement step so as to thermally remove said superconducting film.

2. A method according to claim 1, wherein the step of measuring comprises measuring the resonance frequency of said superconducting device.

3. The method according to claim 1, wherein the step of performing a specific process comprises forming grooves in said superconducting film.

4. The method according to claim 1, wherein said superconducting film comprises a member selected from the group consisting of YBCO oxide, bismuth oxide and thallium oxide.

5. An apparatus for fabricating a superconducting device, comprising:

a X-Y-Z-θ table on which is mounted a superconducting device that comprises a superconducting film formed on a substrate, and which can take up any desired position and attitude;

a cooled portion which is provided above said X-Y-Z-θ table; which forms an environment at less than or equal to a superconducting transition temperature, and which encloses a superconducting device in said environment;

means for measuring a characteristic of said superconducting device that is enclosed in said cooled portion; and means for shining a laser beam onto said superconducting film of said superconducting device that is enclosed in said cooled portion so as to thermally remove said superconducting film.

6. An apparatus according to claim 5, wherein the means for measuring a characteristic of said superconducting device comprises a means for measuring the resonance frequency.

* * * * *